(12) United States Patent
Li

(10) Patent No.: US 10,614,975 B2
(45) Date of Patent: Apr. 7, 2020

(54) RETROFIT SWITCH

(71) Applicant: LEEDARSON AMERICA INC., Smyrna, GA (US)

(72) Inventor: Yongchuan Li, Smyrna, GA (US)

(73) Assignee: LEEDARSON AMERICA INC., Smyrna, GA (US)

( * ) Notice: Subject to any disclaimer, the term of this patent is extended or adjusted under 35 U.S.C. 154(b) by 88 days.

(21) Appl. No.: 15/797,997

(22) Filed: Oct. 30, 2017

(65) Prior Publication Data
US 2019/0131083 A1    May 2, 2019

(51) Int. Cl.
| | |
|---|---|
| *H01H 9/54* | (2006.01) |
| *H01R 13/70* | (2006.01) |
| *H03K 17/96* | (2006.01) |
| *H01H 9/02* | (2006.01) |
| *H05B 37/02* | (2006.01) |

(52) U.S. Cl.
CPC ............ *H01H 9/54* (2013.01); *H01H 9/0271* (2013.01); *H01R 13/701* (2013.01); *H03K 17/96* (2013.01); *H05B 37/0272* (2013.01); *H01H 2300/03* (2013.01); *H03K 2217/94089* (2013.01); *H03K 2217/96015* (2013.01)

(58) Field of Classification Search
CPC .......... H01H 9/0271; H01H 9/16; H01H 9/54; H03K 17/96
See application file for complete search history.

(56) References Cited

U.S. PATENT DOCUMENTS

| | | | |
|---|---|---|---|
| 2016/0126031 A1* | 5/2016 | Wootton | H05B 39/02 361/211 |
| 2017/0099719 A1* | 4/2017 | Smith | F21V 23/0435 |
| 2018/0070429 A1* | 3/2018 | Lark, Jr. | H03K 17/96 |
| 2019/0042000 A1* | 2/2019 | Kasmieh | G06F 3/038 |

* cited by examiner

*Primary Examiner* — Jared Fureman
*Assistant Examiner* — Duc M Pham
(74) *Attorney, Agent, or Firm* — Chun-Ming Shih; Lanway IPR Services

(57) ABSTRACT

A retrofit switch apparatus is designed to pair with a traditional switch device that has a traditional switch for accepting a first user manual operation to control a target device connected to the traditional switch device with an electrical wire. The traditional switch device has a connecting structure. The retrofit switch apparatus has an attaching device, a retrofit housing and a control circuit. The attaching device is attached to the connecting structure of the traditional switch device. The control circuit wirelessly controls the target device.

17 Claims, 6 Drawing Sheets

RETROFIT SWITCH

FIELD OF INVENTION

The present invention relates to a retrofit switch and more particularly related to a retrofit switch capable of wirelessly controlling a target device.

BACKGROUND

IoT (Internet of Things) technologies are developed rapidly and various devices are invented for making human life more convenient. For example, wireless speakers, door locks, lights are easily controlled by a mobile phone via Bluetooth today.

Meanwhile, there are many traditional devices like lamp or downlight installed in a conventional house. It would be very helpful if certain innovative modifications are provided to turn these traditional devices into a controllable IoT network device.

SUMMARY OF INVENTION

Therefore, an objective of the present invention is to provide a retrofit switch apparatus. In an embodiment, the retrofit device is attached to a traditional switch device. The traditional switch device is fixed to an environment surface like a wall. The traditional switch device may also be fixed to other surface like a table, a cabin, car housing and any other devices that traditionally has traditional switch. Examples of such traditional switch includes but not limited to in-wall switches like On/Off Switches, keypads, digital switches, occupancy sensing switches, push-button switches, dimming switches such as rotary dimmers, slide dimmers, digital dimmers, and step dimmers.

Such traditional switch device has a traditional switch mounted on a traditional switch cover surface for accepting a first user manual operation to control a target device. The target device may be a light, an air conditioner, a fan or any other electrical device connected to the traditional switch device with an electrical wire. In some embodiments, such electrical wire is embedded behind a wall. The traditional switch device also has a connecting structure.

The retrofit switch apparatus has an attaching device, a retrofit housing and a control circuit.

The attaching device is used for attaching to the connecting structure of the traditional switch device. The retrofit housing is connected to the attaching device. The control circuit is connected to the retrofit housing for wirelessly controlling the target device. For example, the control circuit may support Bluetooth, ZigBee, Wi-Fi or other wireless communication standard or customized communication protocols.

In some embodiments, the connecting structure is a socket and the attaching device has a pin to plug into the socket. Such connecting structure may be a standard electrical socket that may be found in most houses for providing electrical power to electric devices. In such case, the attaching device may be a standard electrical plug, i.e. having two or more metal plugs associated to standard electrical sockets.

In some embodiments, the attaching device further forwards electrical power from the connecting device to the control circuit when the retrofit switch apparatus is attached to the traditional switch device. With such arrangement, the control circuit has reliable and constant power supply and users do not need to worry to replace batteries for the retrofit switch apparatus.

In some embodiments, the connecting structure is a standard USB socket and the attaching device has a corresponding USB plug to plug into the standard USB socket. In other words, a regulated DC current is provided by the traditional switch device. This saves cost of the design of the retrofit switch apparatus.

In some embodiments, the connecting structure has a first hook structure and the attaching device is a second hook structure corresponding to the first hook structure for hooking the retrofit switch apparatus to the traditional switch device while remaining detachable connection relation. Various hook structures may be designed and all such variations including different pairing structures should be regarded within the invention scope. For example, plugs and associated grooves or sockets may be provided for forming such hook structures. Such hook structures may be designed so that users may easily take the retrofit switch apparatus away from the traditional switch device. Certain fixing level may also be applied to make it more difficult to un-hook the retrofit device from the traditional switch device.

In some embodiments, the retrofit housing exposes the traditional switch. Meanwhile, while the retrofit switch apparatus is connected to the traditional switch device, the traditional switch is disabled even when the traditional switch is operated by a user. The may be achieved by mechanical structure or electrical structure. For example, a sensor may be applied to detect existence of the retrofit switch apparatus. The function of the traditional switch may be disabled, i.e. not effect for operation thereof. Mechanical structures may be designed in the traditional switch device by physically triggering disabling function when the connecting device is attached with the attaching device.

In some embodiments, the attaching device changes operation mode of the traditional switch device to disable the traditional switch when the attaching device is connected to the traditional switch device.

In some embodiments, the traditional switch device may have a disabling switch to disable the traditional switch even when the traditional switch is operated by a user. For example, a toggle button may be disposed on the traditional switch device.

In some embodiments, the retrofit housing hides the traditional switch so that the traditional switch is not operated when the retrofit switch apparatus is connected to the traditional switch device. In other words, the retrofit housing prevents a user to touch the traditional switch so that to prevent accidently turning off power supply to the target device on which a control circuit may needs such power supply to work normally.

In some embodiments, the attaching device may have a rotating device for rotating the retrofit housing with respect to the traditional switch device. For example, a rotating hinge may be used for rotate the retrofit housing with respect to the traditional switch device. The attaching device may be a bracket fixed on the traditional switch device and contains an axis for connecting a portion of the retrofit housing so that a user may rotate the retrofit housing with respect to the traditional switch device.

With such design, the retrofit switch device may have a battery box. When the retrofit housing is rotated with respect to the traditional switch device, the battery box is facing to a user for the user to replace a battery in the battery box.

With such design, when the retrofit housing is rotated with respect to the traditional switch device, the traditional switch may be exposed to a user for the user to operate the traditional switch. This is very important because with such design, a user may easily operate the traditional switch in accident scenario, in the case which a user wants to replace a bulb of the target device, or in the case that the retrofit switch apparatus functions abnormally.

In some embodiments, the traditional switch cover surface has a standard electrical socket and the attaching device has a standard electrical plug to plug into the standard electrical socket. It is common to find such traditional switch in various houses. Or ore two light switches together with one or two standard electrical sockets are integrated as a traditional switch device placed on a wall. In such case, the retrofit switch apparatus is plugged into the electrical socket to attach the retrofit switch apparatus overlapping and covering the original traditional switch on the wall. Meanwhile, the retrofit switch apparatus may include an external standard electrical socket exposed on the retrofit housing for forwarding electrical power from the standard electrical socket of the traditional switch device. In other words, the retrofit switch device may get power supply from the electrical socket and may simply forwards the electrical power to another device plugging into the electrical socket on the retrofit switch apparatus.

In some embodiments, the control circuit is embedded in a control module. The control module is separable from the main body of the retrofit housing. For example, a reception hole is disposed for receiving the control module. With such design, manufacturers may produce the same control modules while pairing such control modules to different retrofit housings to fit different traditional switch device types. Such design saves a lot of manufacturing cost while keeping strong flexibility.

In some embodiments, the control module may include a touch surface for receiving a touch operation from a user to operate the control circuit. For example, variable types of capacitor or resistor touch devices may be used in such embodiments.

In some embodiments, the control module may be disposed with electrical connectors to be connected to a corresponding structure on the retrofit housing to receive power supply from a battery or from the traditional switch device.

Another aspect of the present invention is to provide a traditional switch apparatus for connecting to the retrofit switch apparatuses mentioned above. Such traditional switch apparatus has a similar appearance like convention switch device but new features as mentioned above. Such traditional switch apparatus has a traditional switch and a connecting structure for connecting to the attaching device of the retrofit switch apparatus as mentioned above.

In some embodiments, the connecting structure may even supply electrical power to the control circuit of the retrofit switch apparatus.

DETAILED DESCRIPTION

Therefore, an objective of the present invention is to provide a retrofit switch apparatus. In an embodiment, the retrofit device is attached to a traditional switch device. The traditional switch device is fixed to an environment surface like a wall. The traditional switch device may also be fixed to other surface like a table, a cabin, car housing and any other devices that traditionally has traditional switch. Examples of such traditional switch includes but not limited to in-wall switches like On/Off Switches, keypads, digital switches, occupancy sensing switches, push-button switches, dimming switches such as rotary dimmers, slide dimmers, digital dimmers, and step dimmers.

Such traditional switch device has a traditional switch mounted on a traditional switch cover surface for accepting a first user manual operation to control a target device. The target device may be a light, an air conditioner, a fan or any other electrical device connected to the traditional switch device with an electrical wire. In some embodiments, such electrical wire is embedded behind a wall. The traditional switch device also has a connecting structure.

The retrofit switch apparatus has an attaching device, a retrofit housing and a control circuit.

The attaching device is used for attaching to the connecting structure of the traditional switch device. The retrofit housing is connected to the attaching device. The control circuit is connected to the retrofit housing for wirelessly controlling the target device. For example, the control circuit may support Bluetooth, ZigBee, Wi-Fi or other wireless communication standard or customized communication protocols.

In some embodiments, the connecting structure is a socket and the attaching device has a pin to plug into the socket. Such connecting structure may be a standard electrical socket that may be found in most houses for providing electrical power to electric devices. In such case, the attaching device may be a standard electrical plug, i.e. having two or more metal plugs associated to standard electrical sockets.

In some embodiments, the attaching device further forwards electrical power from the connecting device to the control circuit when the retrofit switch apparatus is attached to the traditional switch device. With such arrangement, the control circuit has reliable and constant power supply and users do not need to worry to replace batteries for the retrofit switch apparatus.

Figure 1:
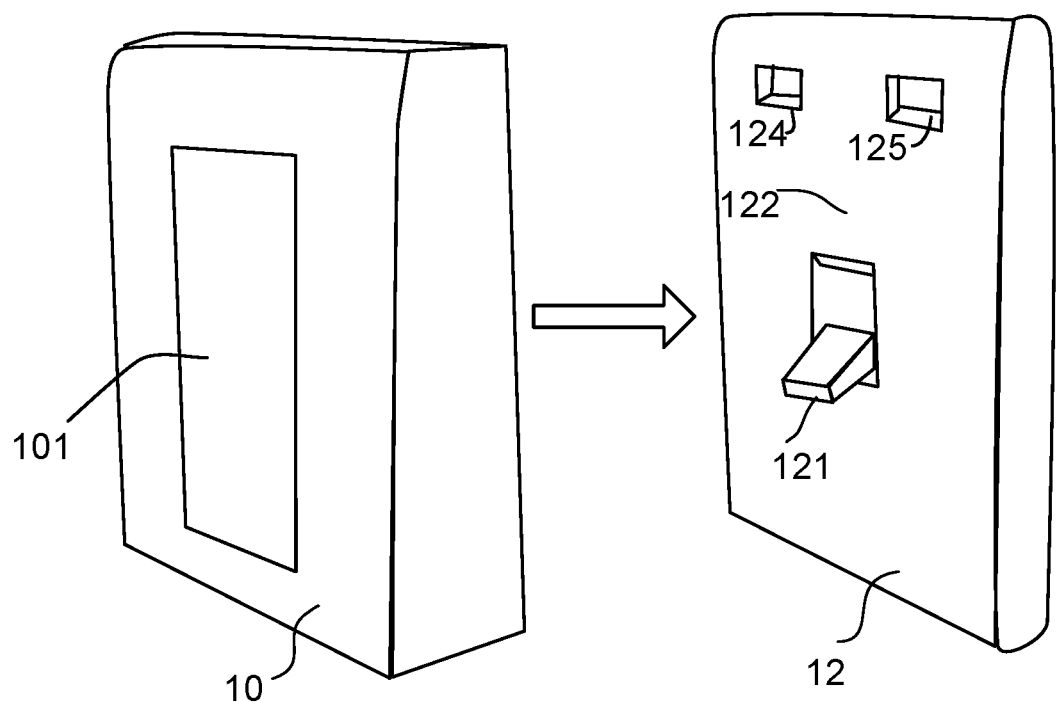
FIG. 1 illustrates attaching a retrofit switch apparatus to a traditional switch device.

Please refer to FIG. 1, which illustrates a retrofit switch apparatus 10 to be attached to a traditional switch device 12. The retrofit switch apparatus 10 may contain a switch 101 that may be the same or different from the traditional switch 121 of the traditional switch device 12. In other words, the retrofit switch apparatus 10 may be used to control the same or even different target devices as that controlled by the traditional switch device 12. In this example, there are two sockets 124, 125 disposed on the traditional switch surface cover 122 as the connecting structure of the traditional switch device 12. The retrofit switch apparatus 10 therefore is disposed with two plug structures (not shown) as the attaching device of the retrofit switch apparatus 10 corresponding to the two sockets 124, 125 and to be plugged into the two sockets 124, 125.

By connecting the attaching device to the connecting structure, the retrofit switch apparatus 10 is attached to the traditional switch device 12. The original traditional switch 121, in this example, is covered by the retrofit switch apparatus 10.

In some embodiment, the connection of the attaching device and the connecting structure provides only physical connection. But, in some other embodiments, the connection may also provide power supply to control circuits in the retrofit switch apparatus 10. There may also be more than one types of the attaching device disposed on the retrofit switch apparatus 10.

Figure 2:
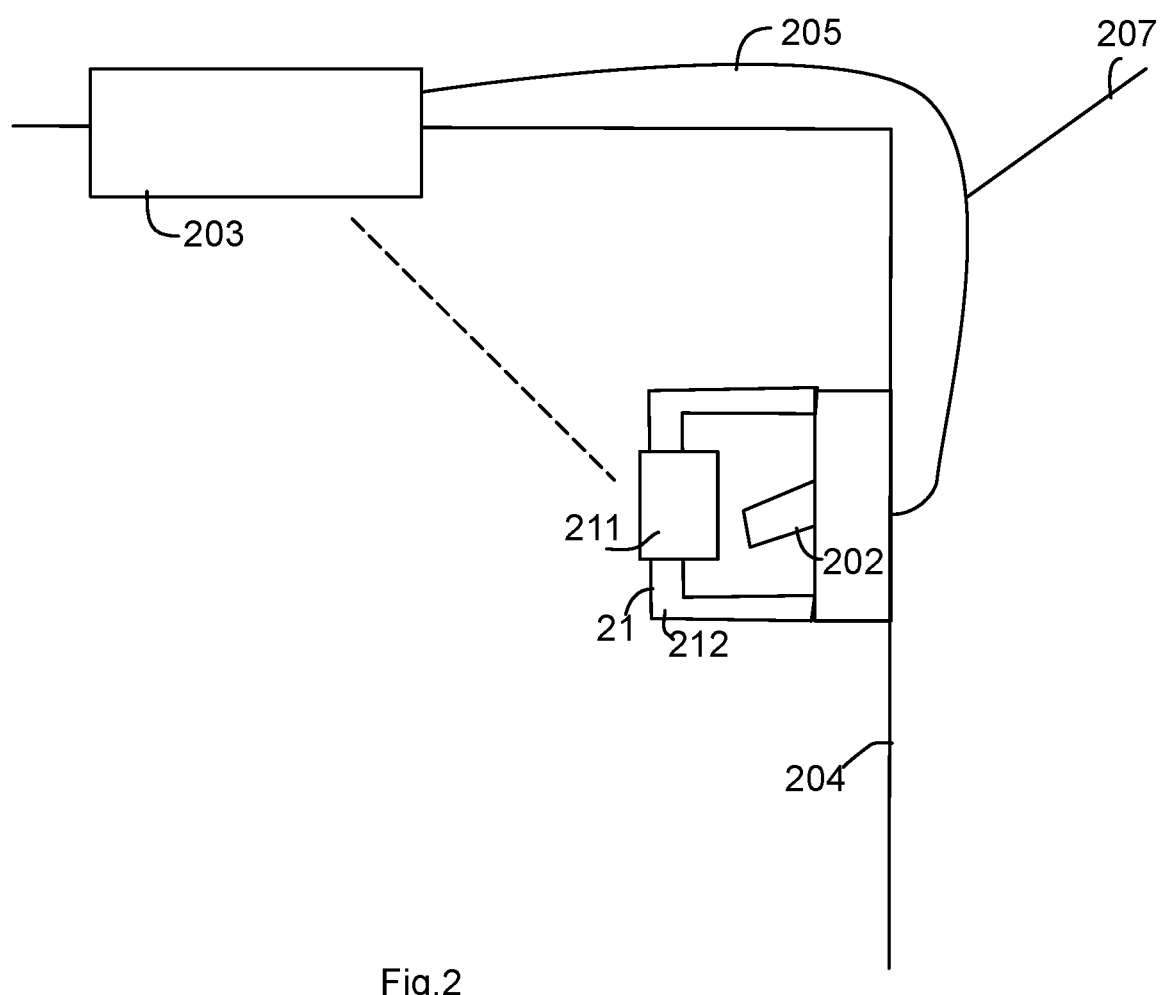
FIG. 2 illustrates relation between a switch and a target device.

Please refer to FIG. 2, which illustrates connection between components of an embodiment. A traditional switch device 202 is connected to a target device 203 via a wire 206 which is further electrically connected to a power source 207. The traditional switch 202 may be used to turn on or turn off the target device by opening or closing an electrical current loop to the power source 207. When a retrofit switch apparatus 21 is attached to the traditional switch device 202, the traditional switch 202 is covered in a containing space defined by a retrofit housing 212. A touch module 211 is connected to the retrofit housing 212 for receiving user touch operation and a wireless controller is used for controlling the target device 203. The wireless controller may be integrated with a touch driver to provide touch and control functions.

Figure 3:
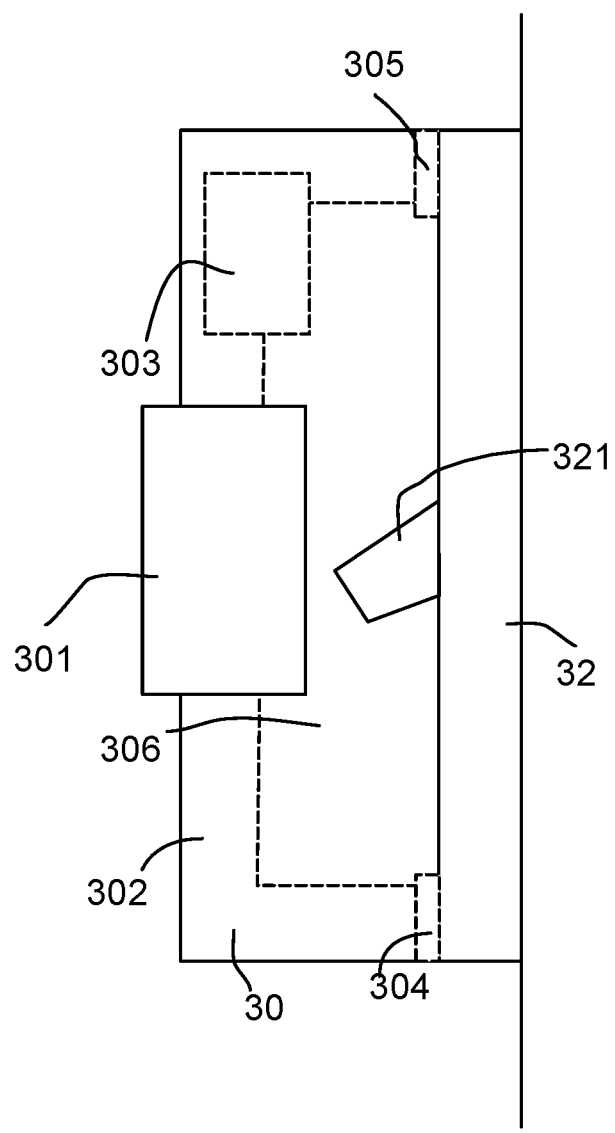
FIG. 3 illustrates a cross section view of a retrofit switch apparatus.

Please refer to FIG. 3, which illustrates an example of a retrofit switch apparatus 30 covering a traditional switch device 32. A traditional switch 321 is covered in a containing space 306 of the retrofit housing 302. A touch module 301 is connected to the retrofit housing 302. Related driver circuit and control circuit 303 may be placed aside, not right below the main body of touch module 301, e.g. under the touch surface of the touch module 301. Attaching devices 304, 305 are used to attaching the retrofit housing 302 to the traditional switch device 32.

Figure 4A:
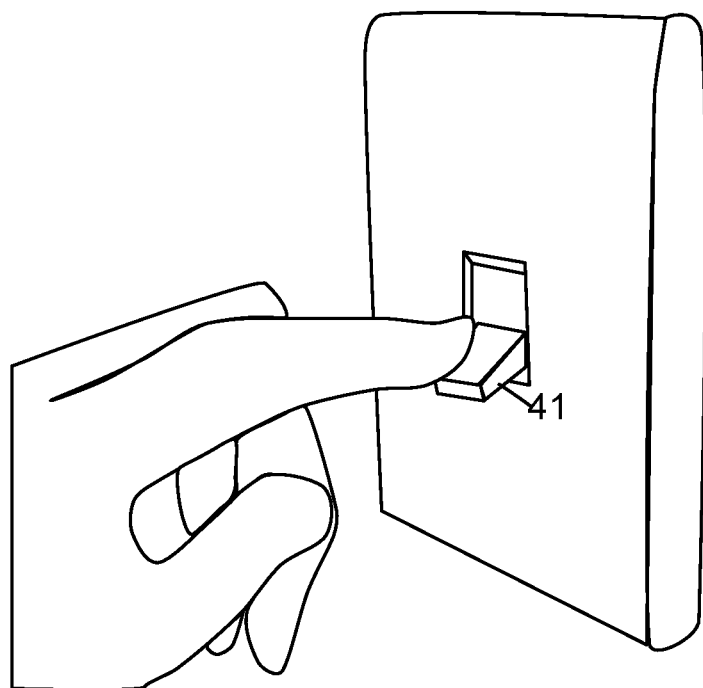
FIG. 4A and FIG. 4B illustrates use scenarios of a traditional switch device and a retrofit switch apparatus.
Figure 4B:
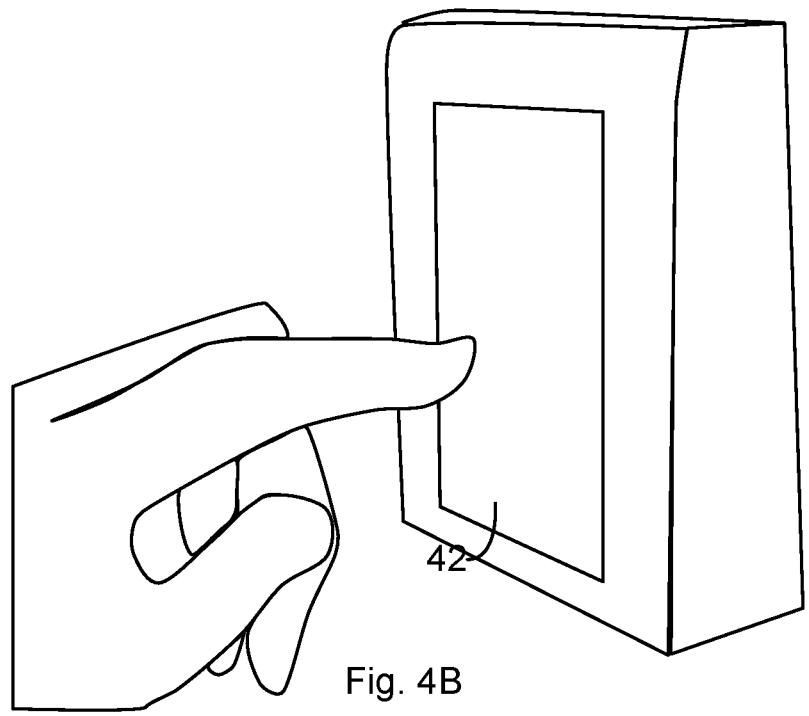

Please refer to FIG. 4A and FIG. 4B, which illustrate difference between operating a traditional switch 41 and operating a touch surface 42. In this example, when the retrofit switch apparatus is attached on the traditional switch device, the traditional switch is hidden from the user and would not be operated by accident.

There are various types of traditional switch devices in the market. Panel plates of some traditional switch devices may be replaced easily. In such case, a replacing plate with the connecting structure as mentioned here is sufficient to create a traditional switch device with the necessary structure to form the embodiments according to the present invention. For example, one or more holes, extruding plugs or other connecting structures may be placed on replacing panel plates to convert an old traditional switch device to a novel traditional switch device to be used in the present invention.

Figure 6:
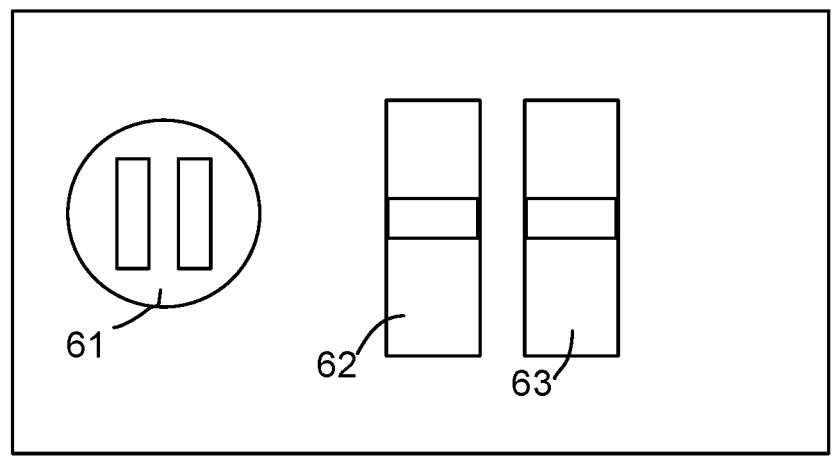
FIG. 6 illustrates a traditional switch device used in an embodiment of the present invention.
Figure 7:
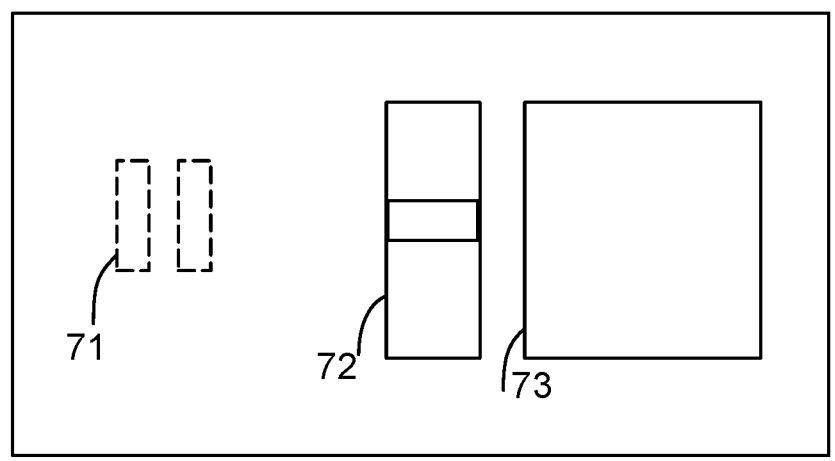
FIG. 7 illustrates a retrofit switch apparatus example.

Please refer to FIG. 6 and FIG. 7. FIG. 6 is a top view showing an example of a traditional switch device. In this example, in addition to two toggle switches 62, 63 as the traditional switches, a standard electrical socket 61 is also existed on the illustrated traditional switch device. FIG. 7 is a top view illustrating a corresponding retrofit switch apparatus having two protruding plugs 71 to be plugged into the standard electrical socket 61 for retrieving electrical power. In addition, when the retrofit switch apparatus is attached on the traditional switch device, the functions of the two traditional switches 62, 63 are now replaced by the two switches 72, 73 on the retrofit switch apparatus. In this example, it is illustrated that the appearance of the switches of the retrofit switch apparatus may not appear like the associated covered traditional switches.

In some embodiments, the connecting structure is a standard USB socket and the attaching device has a corresponding USB plug to plug into the standard USB socket. In other words, a regulated DC current is provided by the traditional switch device. This saves cost of the design of the retrofit switch apparatus.

In some embodiments, the connecting structure has a first hook structure and the attaching device is a second hook structure corresponding to the first hook structure for hooking the retrofit switch apparatus to the traditional switch device while remaining detachable connection relation. Various hook structures may be designed and all such variations including different pairing structures should be regarded within the invention scope. For example, plugs and associated grooves or sockets may be provided for forming such hook structures. Such hook structures may be designed so that users may easily take the retrofit switch apparatus away from the traditional switch device. Certain fixing level may also be applied to make it more difficult to un-hook the retrofit device from the traditional switch device.

In some embodiments, the retrofit housing exposes the traditional switch. Meanwhile, while the retrofit switch apparatus is connected to the traditional switch device, the traditional switch is disabled even when the traditional switch is operated by a user. The may be achieved by mechanical structure or electrical structure. For example, a sensor may be applied to detect existence of the retrofit switch apparatus. The function of the traditional switch may be disabled, i.e. not effect for operation thereof. Mechanical structures may be designed in the traditional switch device by physically triggering disabling function when the connecting device is attached with the attaching device.

In some embodiments, the attaching device changes operation mode of the traditional switch device to disable the traditional switch when the attaching device is connected to the traditional switch device.

In some embodiments, the traditional switch device may have a disabling switch to disable the traditional switch even when the traditional switch is operated by a user. For example, a toggle button may be disposed on the traditional switch device.

In some embodiments, the retrofit housing hides the traditional switch so that the traditional switch is not operated when the retrofit switch apparatus is connected to the traditional switch device. In other words, the retrofit housing prevents a user to touch the traditional switch so that to prevent accidently turning off power supply to the target device on which a control circuit may needs such power supply to work normally.

In some embodiments, the attaching device may have a rotating device for rotating the retrofit housing with respect to the traditional switch device. For example, a rotating hinge may be used for rotate the retrofit housing with respect to the traditional switch device. The attaching device may be a bracket fixed on the traditional switch device and contains an axis for connecting a portion of the retrofit housing so that a user may rotate the retrofit housing with respect to the traditional switch device.

With such design, the retrofit switch device may have a battery box. When the retrofit housing is rotated with respect to the traditional switch device, the battery box is facing to a user for the user to replace a battery in the battery box.

With such design, when the retrofit housing is rotated with respect to the traditional switch device, the traditional switch may be exposed to a user for the user to operate the traditional switch. This is very important because with such design, a user may easily operate the traditional switch in accident scenario, in the case which a user wants to replace a bulb of the target device, or in the case that the retrofit switch apparatus functions abnormally.

Figure 5:
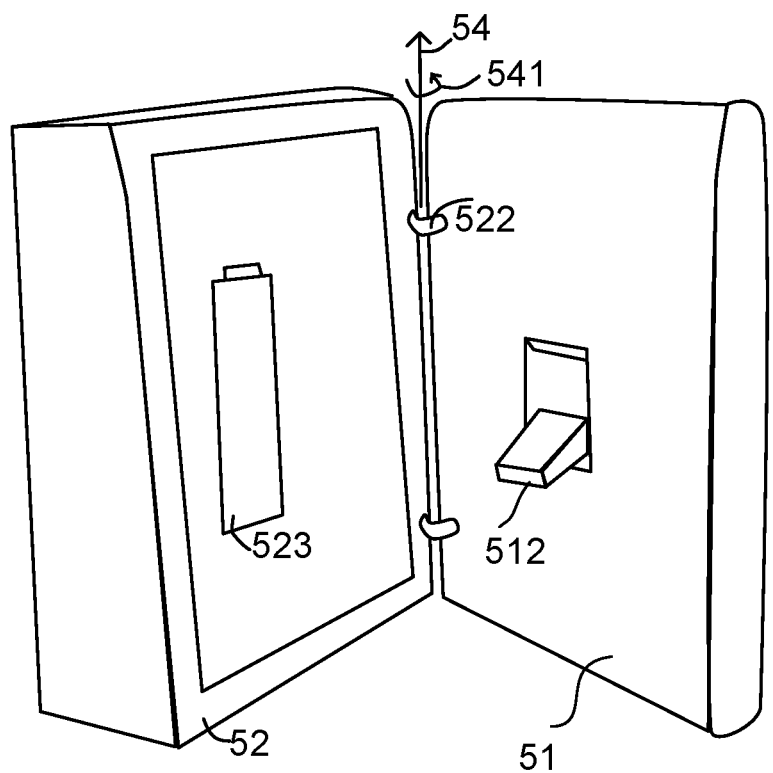
FIG. 5 illustrates a retrofit switch apparatus rotated with respect to a traditional switch device.

Please refer to FIG. 5, which illustrates a diagram in which a retrofit switch apparatus 52 is rotated with respect to a traditional switch device 51. The retrofit switch 52 has an attaching device 522 that defines a rotating axis 54. When the retrofit switch 52 is rotated with respect to the traditional switch apparatus 51 along the rotation direction 541, the traditional switch 512 may be exposed to be used again. In addition, a battery box of the retrofit switch apparatus 52 may be exposed and user may replace a battery 523 to power the wireless controller of the retrofit switch apparatus 52.

In some embodiments, the traditional switch cover surface has a standard electrical socket and the attaching device has a standard electrical plug to plug into the standard electrical socket. It is common to find such traditional switch in various houses. Or ore two light switches together with one or two standard electrical sockets are integrated as a traditional switch device placed on a wall. In such case, the retrofit switch apparatus is plugged into the electrical socket to attach the retrofit switch apparatus overlapping and covering the original traditional switch on the wall. Meanwhile, the retrofit switch apparatus may include an external standard electrical socket exposed on the retrofit housing for forwarding electrical power from the standard electrical socket of the traditional switch device. In other words, the retrofit switch device may get power supply from the electrical socket and may simply forwards the electrical power to another device plugging into the electrical socket on the retrofit switch apparatus.

In some embodiments, the control circuit is embedded in a control module. The control module is separable from the main body of the retrofit housing. For example, a reception hole is disposed for receiving the control module. With such design, manufacturers may produce the same control modules while pairing such control modules to different retrofit housings to fit different traditional switch device types. Such design saves a lot of manufacturing cost while keeping strong flexibility.

In some embodiments, the control module may include a touch surface for receiving a touch operation from a user to operate the control circuit. For example, variable types of capacitor or resistor touch devices may be used in such embodiments.

In some embodiments, the control module may be disposed with electrical connectors to be connected to a corresponding structure on the retrofit housing to receive power supply from a battery or from the traditional switch device.

Another aspect of the present invention is to provide a traditional switch apparatus for connecting to the retrofit switch apparatuses mentioned above. Such traditional switch apparatus has a similar appearance like convention switch device but new features as mentioned above. Such traditional switch apparatus has a traditional switch and a connecting structure for connecting to the attaching device of the retrofit switch apparatus as mentioned above.

In some embodiments, the connecting structure may even supply electrical power to the control circuit of the retrofit switch apparatus.

It is to be understood that the forms of the invention shown and described are preferred embodiments thereof and that various changes and modifications may be made therein without departing from the spirit of the invention or scope as defined in the following claims.

The invention claimed is:

1. A retrofit switch apparatus for being attached to a traditional switch device, the traditional switch device being fixed to an environment surface and having a traditional switch mounted on a traditional switch cover surface of the traditional switch device used for accepting a first user manual operation to control a target device connected to the traditional switch device with an electrical wire, the traditional switch device having a connecting structure, the retrofit switch apparatus comprising:
   an attaching device for attaching to the connecting structure of the traditional switch device;
   a retrofit housing connected to the attaching device; and
   a control circuit connected to the retrofit housing for wirelessly controlling the target device, wherein the connecting structure comprises a first hook structure and the attaching device is a second hook structure corresponding to the first hook structure for hooking the retrofit switch apparatus to the traditional switch device while remaining detachable connection relation.

2. The retrofit switch apparatus of claim 1, wherein the connecting structure is a socket and the attaching device comprises a pin to plug into the socket.

3. The retrofit switch apparatus of claim 1, wherein the connecting structure is a standard electrical socket and the attaching device is a standard electrical plug.

4. The retrofit switch apparatus of claim 3, wherein the attaching device forwards electrical power from the connecting device to the control circuit when the retrofit switch apparatus is attached to the traditional switch device.

5. The retrofit switch apparatus of claim 1, wherein the connecting structure is a standard USB socket and the attaching device comprises a corresponding USB plug to plug into the standard USB socket.

6. The retrofit switch apparatus of claim 1, wherein the retrofit housing exposes the traditional switch but while the retrofit switch apparatus is connected to the traditional switch device, the traditional switch is disabled even when the traditional switch is operated by a user.

7. The retrofit switch apparatus of claim 6, wherein the attaching device changes operation mode of the traditional switch device to disable the traditional switch when the attaching device is connected to the traditional switch device.

8. The retrofit switch apparatus of claim 1, wherein the traditional switch device has a disabling switch to disable the traditional switch even when the traditional switch is operated by a user.

9. The retrofit switch apparatus of claim 1, wherein the retrofit housing hides the traditional switch so that the traditional switch is not operated when the retrofit switch apparatus is connected to the traditional switch device.

10. The retrofit switch apparatus of claim 9, wherein the attaching device comprises a rotating device for rotating the retrofit housing with respect to the traditional switch device.

11. The retrofit switch apparatus of claim 10, further comprising a battery box and when the retrofit housing is rotated with respect to the traditional switch device, the battery box is facing to a user for the user to replace a battery in the battery box.

12. The retrofit switch apparatus of claim 10, wherein when the retrofit housing is rotated with respect to the traditional switch device, the traditional switch is exposed to a user for the user to operate the traditional switch.

13. The retrofit switch apparatus of claim 1, wherein the traditional switch cover surface has a standard electrical socket and the attaching device comprising a standard electrical plug to plug into the standard electrical socket.

14. The retrofit switch apparatus of claim 13, further comprising an external standard electrical socket exposed on the retrofit housing for forwarding electrical power from the standard electrical socket of the traditional switch device.

15. The retrofit switch apparatus of claim 1, wherein the control circuit is embedded in a control module, the control module is separable from the retrofit housing so that the control module is capable of being assembled to different types of the retrofit housing.

16. The retrofit switch apparatus of claim 15, wherein the control module comprises a touch surface for receiving a touch operation from a user to operate the control circuit.

17. The retrofit switch apparatus of claim 15, wherein the control module has electrical connectors to be connected to the retrofit housing.

* * * * *